(12) United States Patent
Kwon et al.

(10) Patent No.: US 11,107,829 B2
(45) Date of Patent: Aug. 31, 2021

(54) METHOD OF MANUFACTURING A THREE-DIMENSIONAL NON-VOLATILE MEMORY DEVICE

(71) Applicant: SK hynix Inc., Gyeonggi-do (KR)

(72) Inventors: Eun Mee Kwon, Gyeonggi-do (KR); Da Som Lee, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/562,100

(22) Filed: Sep. 5, 2019

(65) Prior Publication Data

US 2020/0194441 A1 Jun. 18, 2020

(30) Foreign Application Priority Data

Dec. 17, 2018 (KR) .......................... 10-2018-0163126

(51) Int. Cl.
*H01L 27/1158* (2017.01)
*H01L 27/11573* (2017.01)
*H01L 27/11565* (2017.01)
*H01L 27/11519* (2017.01)
*H01L 27/11514* (2017.01)
(Continued)

(52) U.S. Cl.
CPC .... *H01L 27/1158* (2013.01); *H01L 27/11504* (2013.01); *H01L 27/11509* (2013.01); *H01L 27/11514* (2013.01); *H01L 27/11519* (2013.01); *H01L 27/11526* (2013.01); *H01L 27/11553* (2013.01); *H01L 27/11565* (2013.01); *H01L 27/11573* (2013.01)

(58) Field of Classification Search
None
See application file for complete search history.

(56) References Cited

U.S. PATENT DOCUMENTS 8,765,538 B2   7/2014  Kim et al.
9,373,635 B2 * 6/2016  Jung ................... H01L 27/0688
(Continued)

FOREIGN PATENT DOCUMENTS

KR   1020130023767    3/2013
KR   1020160137091    11/2016

OTHER PUBLICATIONS

Weigold, J. W. et al., Etching and boron diffusion of high aspect ratio Si trenches for released resonators, J. Vac, Sci. Technol. B, Mar./Apr. 1997, pp. 267-272, vol. 15, No. 2, American Vacuum Society.
(Continued)

*Primary Examiner* — Dung A. Le
(74) *Attorney, Agent, or Firm* — IP & T Group LLP

(57) ABSTRACT

In a method of manufacturing a non-volatile memory device, insulating layers and conductive gates may be alternately formed on a semiconductor substrate to form a stack structure. A contact hole may be formed through the stack structure. A channel layer may be formed on a surface of the contact hole. The contact hole may be filled with a gap-fill insulating layer. The gap-fill insulating layer may be etched by a target depth to define a preliminary junction region. The channel layer may be etched until a surface of the channel layer may correspond to a surface of an uppermost gate among the gates. Diffusion-preventing ions may be implanted into the channel layer. A capping layer with impurities may be formed in the preliminary junction region.

19 Claims, 21 Drawing Sheets

(51) Int. Cl.
*H01L 27/11553* (2017.01)
*H01L 27/11504* (2017.01)
*H01L 27/11509* (2017.01)
*H01L 27/11526* (2017.01)

(56) References Cited

U.S. PATENT DOCUMENTS

| | | | |
|---|---|---|---|
| 9,543,401 B2 | 1/2017 | Kim et al. | |
| 2012/0139027 A1* | 6/2012 | Son | H01L 29/7926 257/324 |
| 2014/0264525 A1* | 9/2014 | Takahashi | H01L 27/11563 257/314 |
| 2015/0060977 A1* | 3/2015 | Lee | H01L 27/1157 257/314 |
| 2016/0149049 A1 | 5/2016 | Sharangpani et al. | |
| 2017/0365613 A1* | 12/2017 | Gunji-Yoneoka | H01L 27/11524 |
| 2018/0366486 A1 | 12/2018 | Hada et al. | |
| 2019/0305095 A1 | 10/2019 | Choi | |
| 2020/0194441 A1 | 6/2020 | Kwon et al. | |
| 2020/0295025 A1 | 9/2020 | Lu et al. | |
| 2020/0342939 A1 | 10/2020 | Widjaja | |

OTHER PUBLICATIONS

Office Action issued by the USPTO for U.S. Appl. No. 16/561,604 dated Feb. 11, 2021.

* cited by examiner

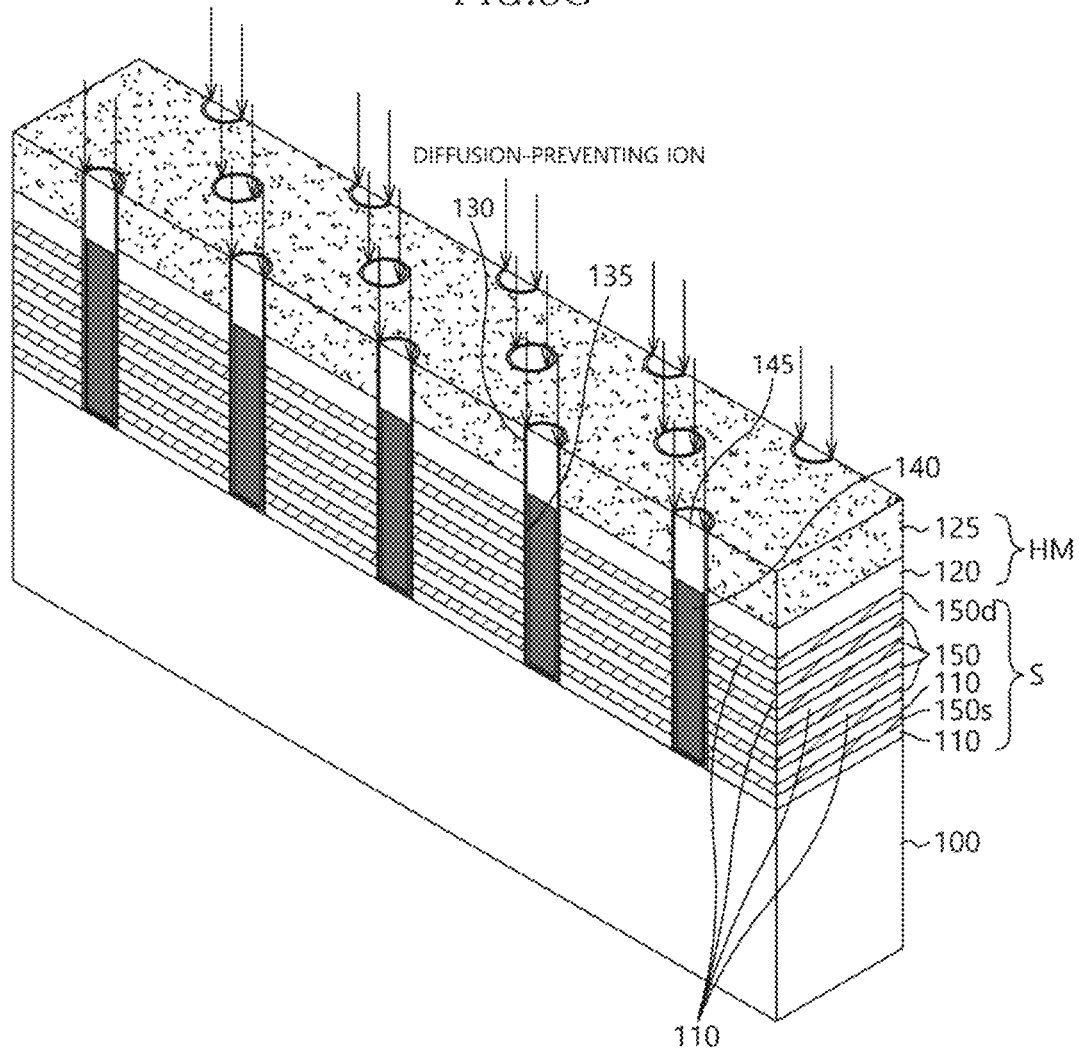

METHOD OF MANUFACTURING A THREE-DIMENSIONAL NON-VOLATILE MEMORY DEVICE

CROSS-REFERENCES TO RELATED APPLICATION

The present application claims priority under 35 U.S.C. § 119(a) to Korean application number 10-2018-0163126, filed on Dec. 17, 2018, which is incorporated herein by reference in its entirety.

BACKGROUND

1. Technical Field

Various embodiments of the present invention generally relate to non-volatile memory device technology and, more particularly, to a three-dimensional (3D) non-volatile memory (NVM) device having improved characteristics and a method of manufacturing the 3D, NVM device. The method may improve the electrical characteristics of the 3D, NVM device.

2. Related Art

Generally, there is an ever-increasing consumer demand for smaller size, and/or higher data processing capacity electronic devices. This, in turn requires to increase the integration degree of the semiconductor memory devices that are employed in the electronic devices. For increasing the integration degree of the semiconductor memory devices, 3D, NVM devices having a vertical transistor structure in place of a planar transistor structure have been developed. 3D, NVM devices are rather new technology and significant research and development continues to flow into these devices for improving their capacity, structural integrity, and other performance characteristics.

SUMMARY

The present disclosure in its broadest aspects relates to an improved three-dimensional (3D) non-volatile memory (NVM) device and a method for making the same. The inventive 3D non-volatile memory device exhibits improved performance characteristics. In particular the method reduces variation in the polysilicon field oxide height (PFH) of transistors of the 3D NVM device.

According to an aspect of the present disclosure, a method of manufacturing a 3D, NVM device is provided. The method comprises alternately forming insulating layers and conductive gates on a semiconductor substrate to form a stack structure. A contact hole may be formed through the stack structure. A channel layer may be formed on a surface of the contact hole. The contact hole may be filled with a gap-fill insulating layer. The gap-fill insulating layer may be etched by a target depth to define a preliminary junction region. The channel layer may be etched until a surface of the channel layer may correspond to a surface of an uppermost gate among the gates. Diffusion-preventing ions may be implanted into the channel layer. A capping layer with impurities may be formed in the preliminary junction region.

In an embodiment of the present invention disclosure, a channel layer may be formed on a surface of the contact hole. The contact hole may be filled with a gap-fill insulating layer. The gap-fill insulating layer may be etched before a thickness of the gap-fill insulating layer may reach to a target depth to define a preliminary junction region. Impurities may be implanted into the channel layer surrounding an edge of an uppermost gate among the gates to form a junction extension region. A capping layer with impurities may be formed in the preliminary junction region.

BRIEF DESCRIPTION OF THE DRAWINGS

The above and other aspects, features, and advantages of the subject matter of the present invention disclosure will be more clearly understood from the following detailed description taken in conjunction with the accompanying drawings, in which:

FIGS. 3A to 3H are perspective views illustrating a method of manufacturing a 3D, NVM device in accordance with an embodiment of the present invention;

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

It is also noted that many other embodiments may be envisioned by those with ordinary skill in the art wherein a feature described in conjunction with one of the described embodiments may be employed with one or more features of another described embodiment without departing from the spirit and scope of the present invention.

It is also noted that in describing the invention well known details are omitted in order to avoid obscuring the description of the essence of the invention.

Figure 1:
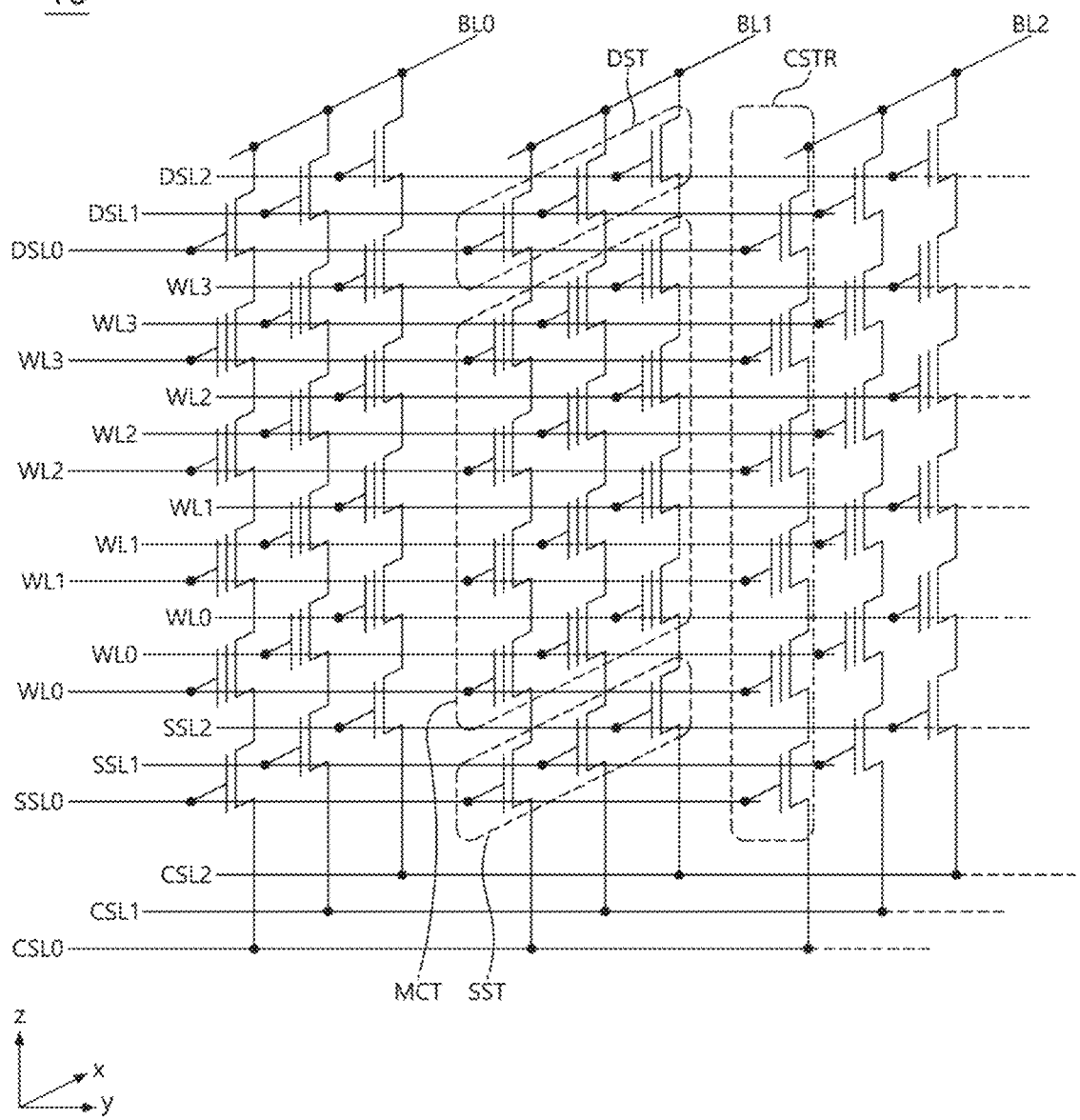
FIG. 1 is a circuit diagram illustrating a cell array of a 3D, NVM device in accordance with an embodiment of the present invention.

FIG. 1 is a circuit diagram illustrating a cell array of a 3D, NVM device in accordance with an embodiment of the present invention. The cell array is generally designated with numeral 10.

Referring now to FIG. 1, the cell array 10 may include a plurality of common source lines CSL0 to CSL2, word lines WL0 to WL3, source select lines SSL0 to SSL2, drain select lines DSL0 to DSL2 and bit lines BL0 to BL2. The common source lines CSL0 to CSL2 may be parallel to each other. The common source lines CSL0 to CSL2, the word lines WL0 to WL3, the source select lines SSL0 to SSL2, and the drain select lines DSL0 to DSL2 may extend in a second direction y. The first and second directions may be perpendicular or substantially perpendicular to each other. However, the invention is not limited in this way and the first and second directions may be crossing at a different angle. The bit lines BL0 to BL2 may be parallel to each other and extend in the first direction. The common source lines CSL0 to CSL2 and the bit lines BL0 to BL2 may extend in directions which intersect each other.

The cell array 10 of the 3D, NVM device may include a plurality of cell strings CSTR. The cell strings CSTR may be connected between corresponding intersected points of the common source lines CSL0 to CSL2 and the bit lines BL0 to BL2. Each cell string may extend in a third direction z. The third direction z may be perpendicular or substantially perpendicular to the plane of the first and second directions x and y. However, the invention may not be limited in this way and in other embodiments the third direction may be crossing with the plane of the first and second directions at a different angle.

The cell strings CSTR connected to one of the bit lines BL0 to BL2 may be connected to the plurality of common source lines CSL0 to CSL2. The cell strings CSTR connected to one of the common source lines CSL0 to CSL2 may be connected to the plurality of bit lines BL0 to BL2. The common source lines CSL0 to CSL2 may receive a same voltage or different voltages.

Each of the cell strings CSTR may include a source selection transistor SST connected with one of the common source lines CSL0 to CSL2, a drain selection transistor DST connected with one of the bit lines BL0 to BL2, and a plurality of memory cell transistors MCT connected in series between the source selection transistor SST and the drain selection transistor DST.

The source selection transistor SST, the memory cell transistors MCT and the drain selection transistor DST connected to one of the common source lines CSL0 to CSL2 and one of the bit lines BL0 to BL2 may be serially connected with each other.

The source selection transistor SST may include a source connected with a corresponding one of the common source lines CSL0 to CSL2, a gate connected with a source selection line SSL, and a drain connected with a memory cell transistor MCT. Each of the memory cell transistors MCT may be selected by a corresponding one of the word lines WL0 to WL3. In the illustrated embodiment, as an example, the word lines WL0 to WL3 are shown to extend in the second direction y which is perpendicular or substantially perpendicular to the first direction x which is the extending direction of the bit lines BL0 to BL2. However, the invention may not be limited in this way. The drain selection transistor DST may include a source connected with a memory cell transistor MCT, a gate connected with a corresponding one of the drain selection lines DSL0 to DSL2, and a drain connected to a corresponding one of the bit lines BL0 to BL2. Each of the memory cell transistors MCT may include a data storage element.

Figure 2:
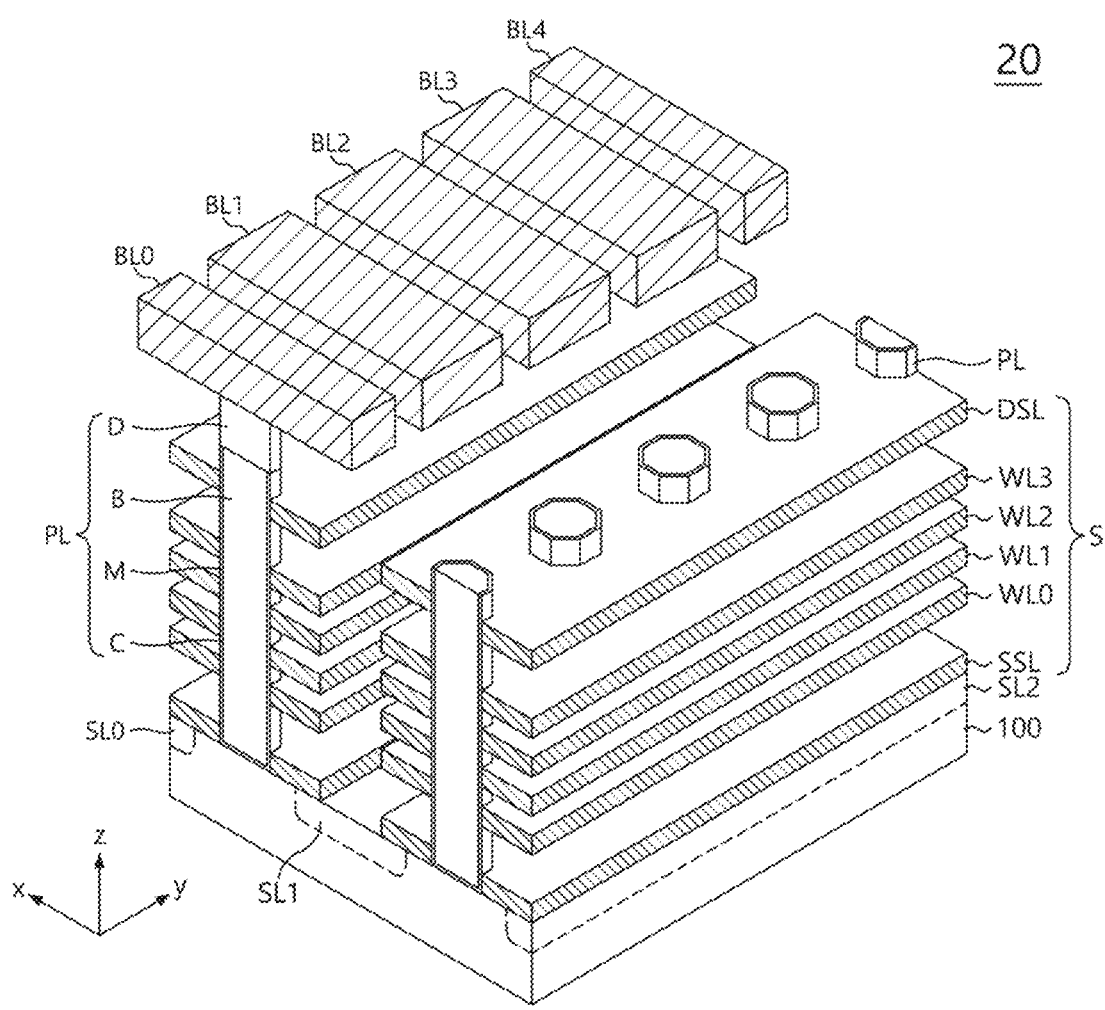
FIG. 2 is a perspective view illustrating a cell array of a 3D, NVM device in accordance with an embodiment of the present invention.

FIG. 2 is a perspective view illustrating a cell array of a 3D, NVM device in accordance with an embodiment of the present invention.

Referring to FIG. 2, the common source lines CSL0 to CSL2 may include a conductive layer or a junction region in a semiconductor substrate 100. Bit lines BL0 to BL2 may be formed at a position vertically spaced apart from the semiconductor substrate 100. The bit lines BL0 to BL2 may include a conductive pattern. The cell strings CSTR may be connected between the common source lines CSL0 to CSL2 and the bit lines BL0 to BL2. The cell strings CSTR may have the form of channel pillars PL.

Each of the channel pillars PL may be surrounded by a stack S. The stack S may include a source selection line SSL, the word lines WL0 to WL3 and the drain selection line DSL which are stacked between the source lines CSL0 to CSL2 and the bit lines BL0 to BL2. Gaps interposed between the source selection line SSL and the word line, between the word lines WL0 to WL3, and between word line W3 and the drain selection line DSL correspond to insulating material layers. The source selection line SSL and the drain selection line DSL may each be a single layer or a multi-layer.

Each of the stacks S may include a plurality of channel pillars PL extended from a surface of the semiconductor substrate 100 to corresponding bit lines BL0 to BL2. Each of the channel pillars PL may extend in the third direction and be formed in a hole passing through the source selection line SSL, the word lines WL0 to WL3 and the drain selection line DSL. Each of the channel pillars PL may include a memory layer M, a channel layer C, a gap-fill insulating layer B and a capping layer D. The channel pillar PL may be formed by first forming a hole penetrating the stack, and then forming the channel layer C and the memory layer M on a side wall of the hole and a bottom surface of the hole. The gap-fill insulating layer B may fill the remaining gap inside the hole. The capping layer D may be formed on top of the gap-fill insulating layer B to fill a portion of the hole remaining between the top of the gap-fill insulating layer B and a corresponding bit line. The top of the gap-fill insulating layer B may be above the top of the drain select line. The capping layer D may function as a junction region of the drain selection transistor DST in FIG. 1. The memory layer M may include a charge storage layer. For example, the memory layer M may include an insulating layer having a trap insulating layer, a floating gate electrode or conductive nano dots. Data in the memory layer M may be changed by a Fowler-Nordheim tunneling caused by a voltage difference between the channel pillar PL and the word lines WL0 to WL3. Alternatively, the memory layer M may store information using other operational principles. For example, the memory layer M may include a phase changeable layer or a variable resistive layer. Although not depicted in the drawings, a gate insulating layer may be formed on the memory layer M.

When variable voltages are applied to the source selection line SSL, the word lines WL0 to WL3 and the drain selection line DSL, a charge transmission path, i.e., a channel may be formed ion the memory layer M of the channel pillar PL so that the memory layer M may be driven as a MOSFET or a MOS capacitor.

Further, although not depicted in the drawings, a peripheral circuit for selecting the cell strings CSTR may be arranged between the semiconductor substrate 100 and the cell strings CSTR.

FIGS. 3A to 3H are perspective views illustrating a method of manufacturing a 3D, NVM device in accordance with an embodiment of the present invention, and FIGS. 4A to 4H are cross-sectional views illustrating a method of manufacturing a 3D, NVM device in accordance with an embodiment of the present invention. The FIGS. 4A to 4H correspond to the FIGS. 3A to 3H.

Figure 3A:
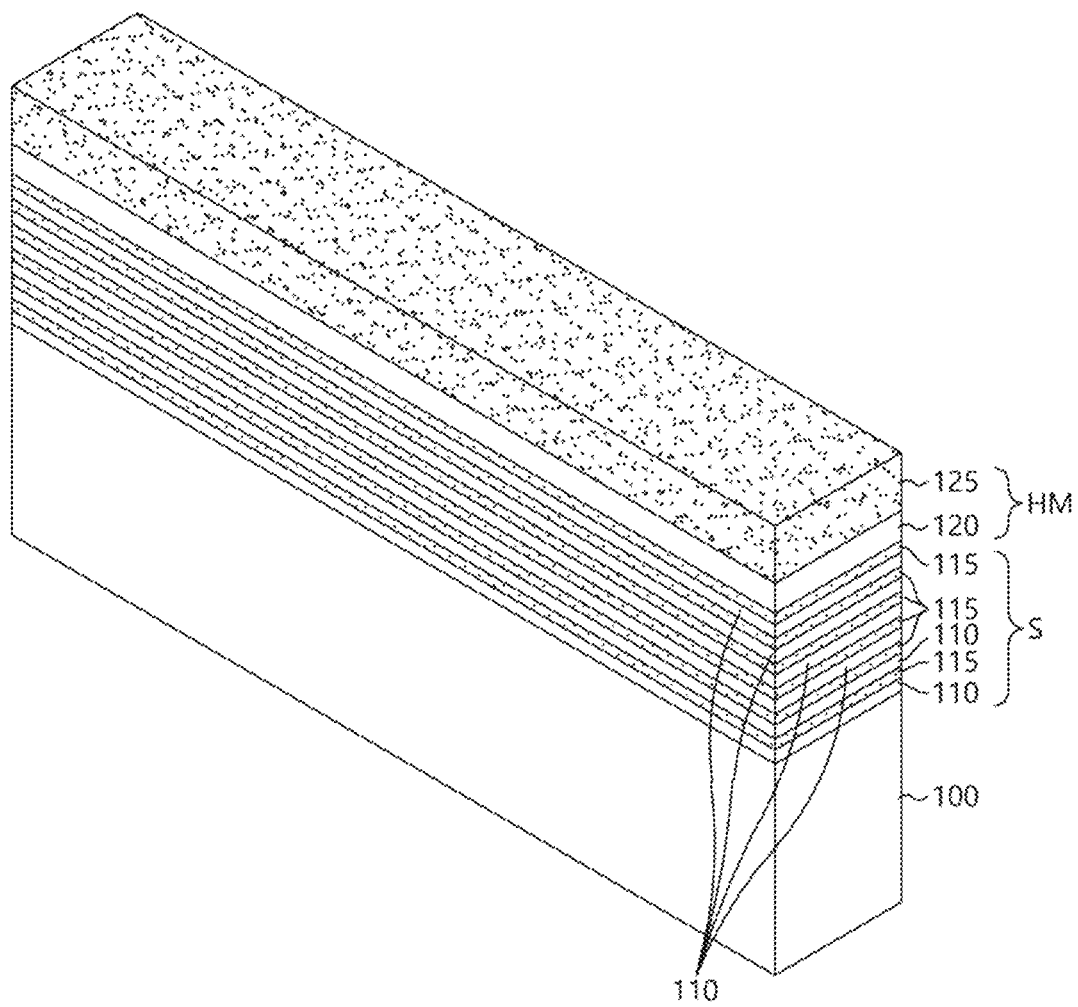
Figure 4A:
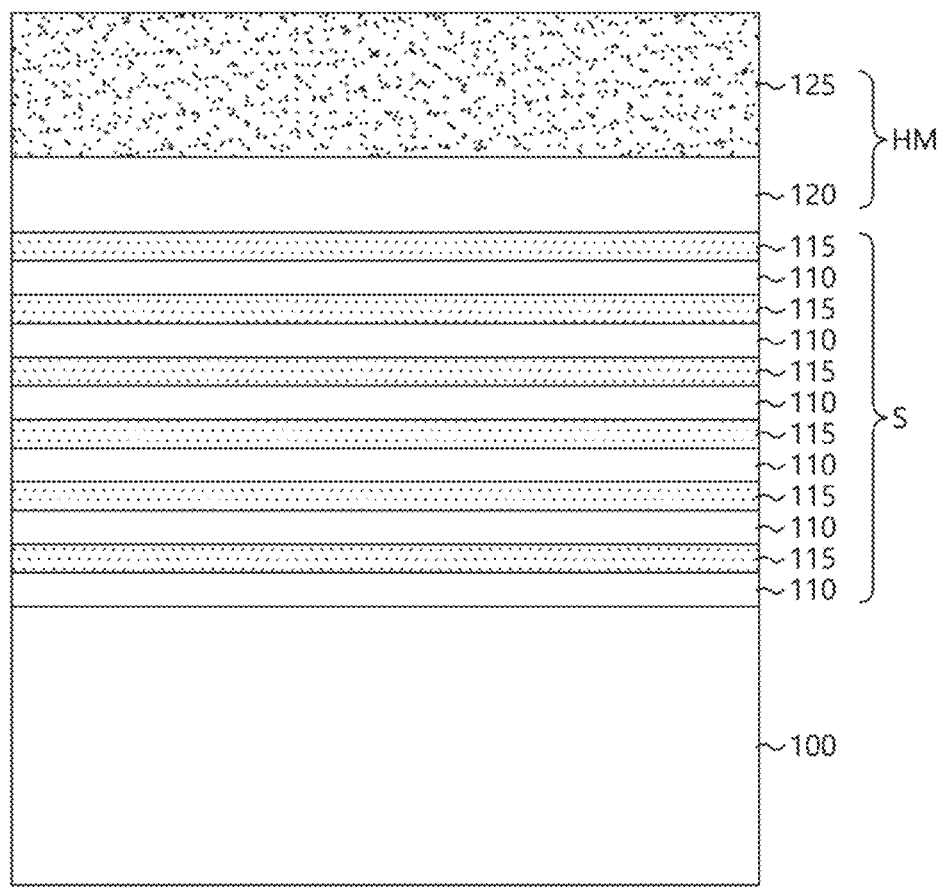
FIGS. 4A to 4H are cross-sectional views illustrating a method of manufacturing a 3D, NVM device in accordance with an embodiment of the present invention.

Referring to FIGS. 3A and 4A, a plurality of first layers 110 and a plurality of second layers 115 may be alternately formed on the semiconductor substrate 100 to form a stack structure S. The second layers 115 may include a material having an etching selectivity different from a material of the first layer 110. For example, in an embodiment, the first layers 110 may include a silicon oxide layer and the second layers 115 may include a silicon nitride layer. The second layers 115 may function as sacrificial layers for defining a plurality of corresponding gate regions. The number of the second layers 115 in the stack S may correspond to the number of transistors in the cell strings CSTR in FIG. 1 and FIG. 2. The first layers 110 of the stack structure S may each have a first thickness. The second layers 115 of the stack structure S may each have a second thickness. The first and the second thicknesses may be equal or different. In the illustrated embodiment, as an example, the first thickness may be greater than the second thickness.

A hard mask layer HM may be formed on the stack structure S. The hard mask layer HM may include first and second layers 120 and 125. The first layer 120 may be made of a first suitable insulator material and may be, for example, a silicon oxide layer. The second layer 125 may be made of a second suitable insulator material and may be, for example, a silicon nitride layer.

A hard mask layer HM may be formed on the stack structure S. The hard mask layer HM may include first and second layers 120 and 125. The first layer 120 may be made of a first suitable insulator material and may be, for example, a silicon oxide layer. The second layer 125 may be made of a second suitable insulator material and may be, for example, a silicon nitride layer. Peripheral circuits (not shown) such as a row decoder circuit and a column decoder circuit may be arranged between the semiconductor substrate 100 and the stack structure S.

Figure 3B:
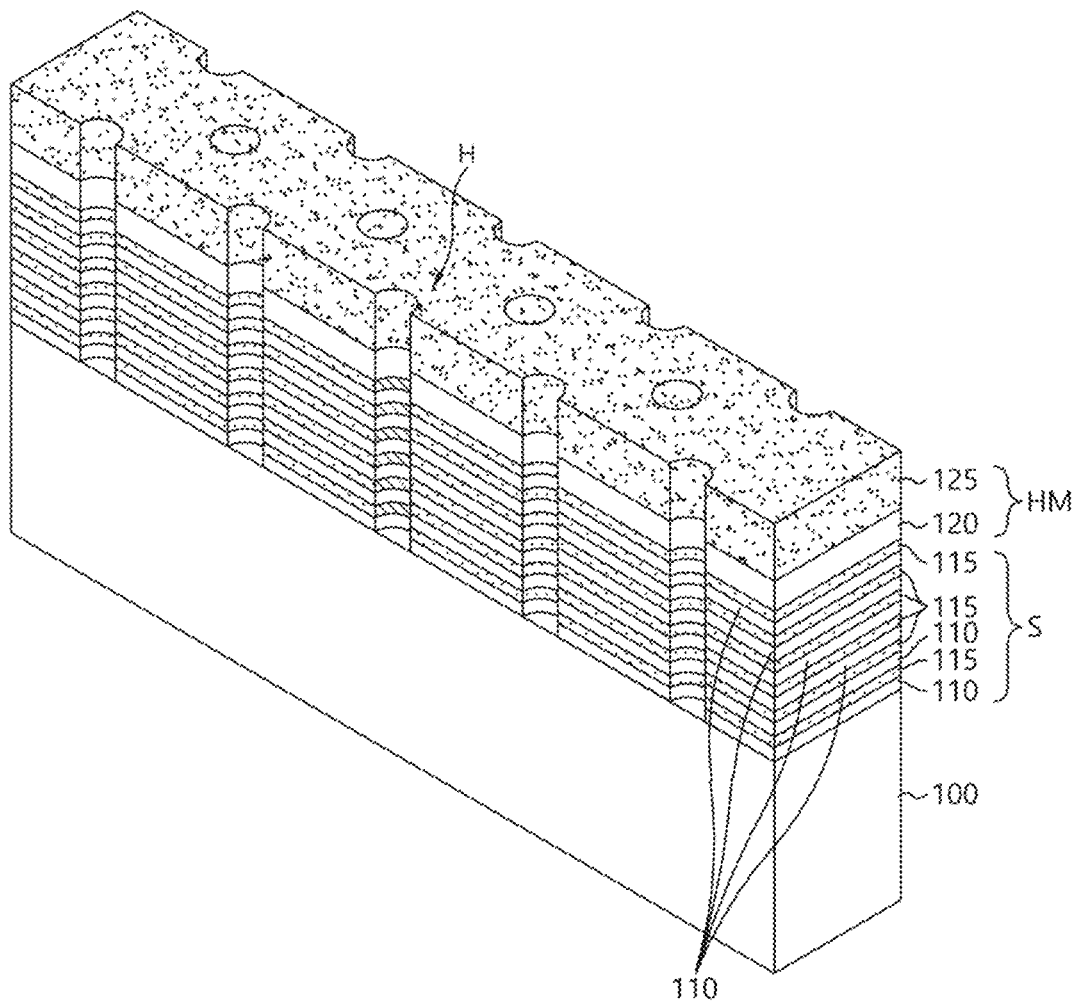
Figure 4B:
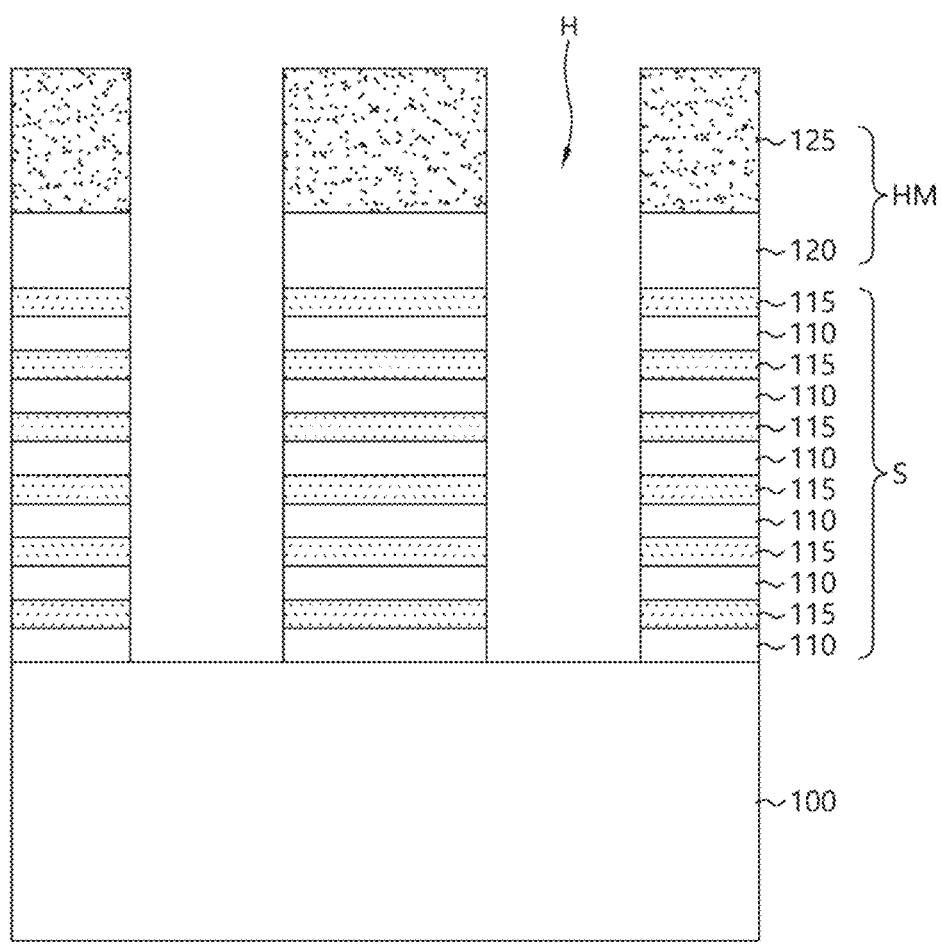

Referring to FIGS. 3B and 4B, a photoresist pattern (not shown) may be formed on the hard mask layer. The hard mask layer may be patterned using the photoresist pattern to form a hard mask pattern HM. The stack structure S may be etched using the hard mask pattern HM as an etch mask to form a contact holes H through the stack structure S. The contact holes H may be extending in the third direction z through the stack structure S. The contact holes H may be arranged in spaced intervals in any suitable pattern along the x and y directions. For example, the holes H may be arranged in a zig-zag pattern along the first and second directions x and y.

Figure 3C:
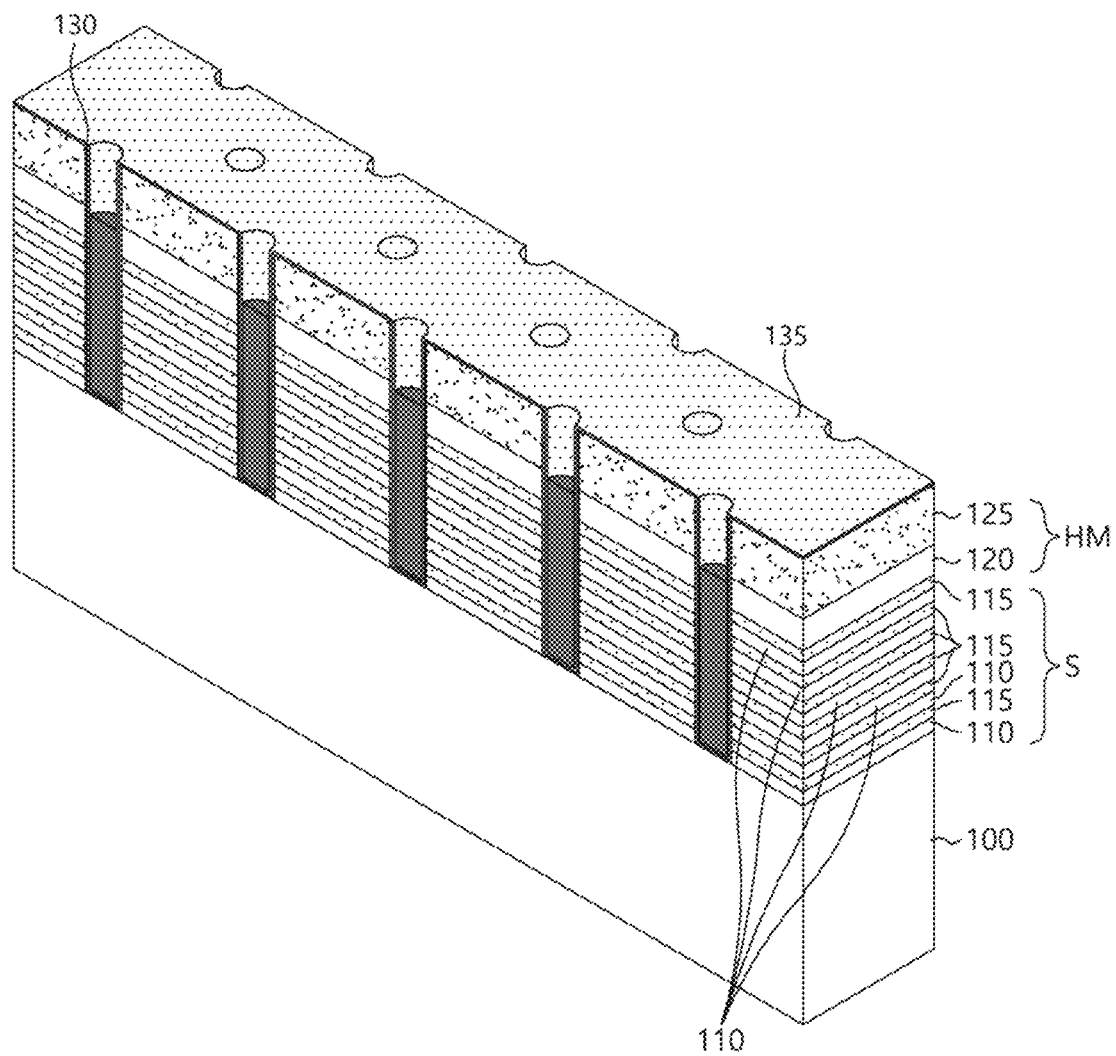
Figure 4C:
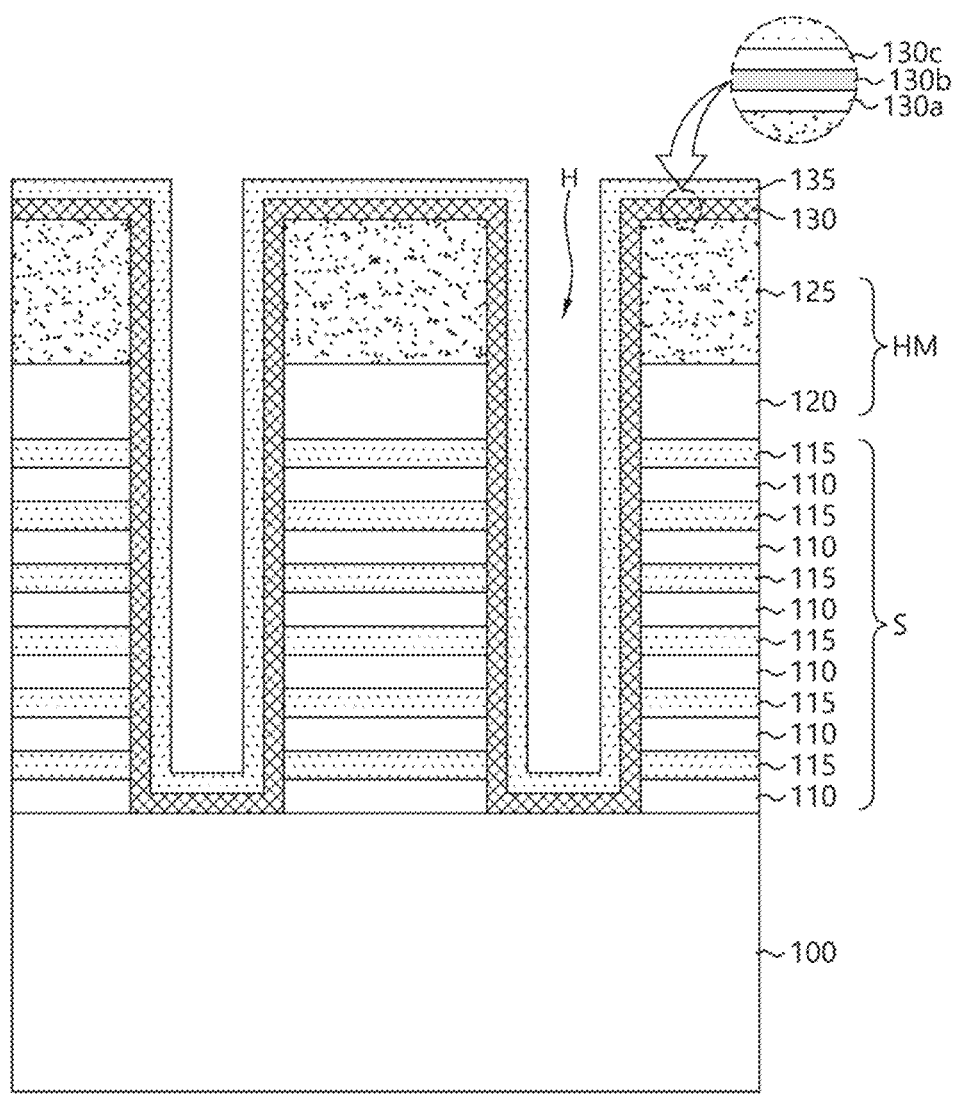

Referring to FIGS. 3C and 4C, a memory layer 130 may be formed on an upper surface of the hard mask pattern HM and conformally over an internal surface of the side wall and the bottom wall of each of the contact holes H. In an embodiment, the memory layer 130 may include at least one of a charge blocking layer 130a, a data storage layer 130b and a tunnel insulating layer 130c. The data storage layer 130b may include a silicon layer, a silicon nitride layer, a phase changeable layer, a ferroelectrics layer, nano dots, etc.

A channel layer 135 may be formed along the memory layer 130. For example, the channel layer 135 may include an intrinsic polysilicon layer or a polysilicon layer doped with impurities. The memory layer 130 and the channel layer 135 may be formed sequentially with the memory layer 130 formed first to cover an upper surface of the hard mask layer HM and an inner surface of each contact hole H and the channel layer 135 formed second to cover the memory layer 130. The memory layer 130 and the channel layer 135 may be formed using an atomic layer deposition process, however, the invention may not be limited in this way.

In an embodiment, the memory layer 130 and the channel layer 135 may be formed in each of the contact holes H. Alternatively, the memory layers 130 and the channel layers 135 may be formed in adjacent contact holes H and may be connected with each other through a buried hole in the semiconductor substrate 100.

Figure 3D:
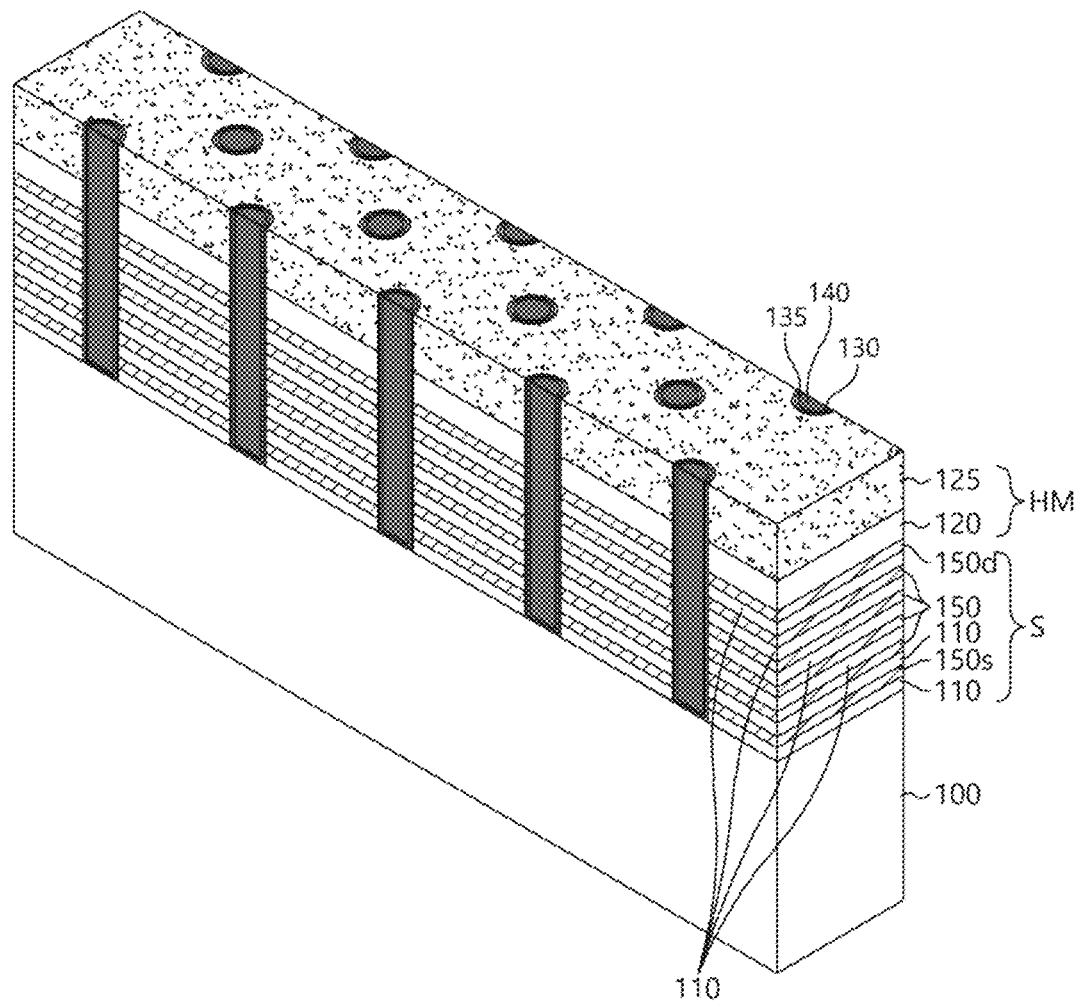
Figure 4D:
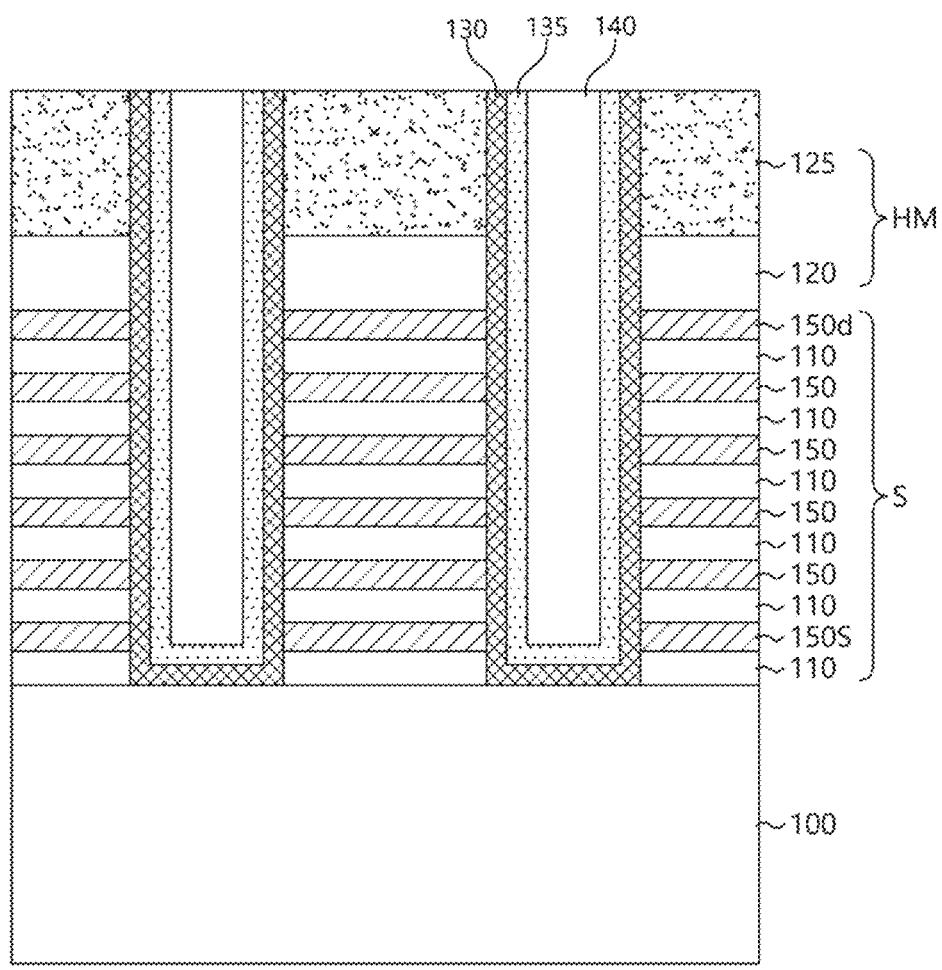

Referring to FIGS. 3D and 4D, a gap-filling insulation layer 140 may be formed on a surface of the channel layer 135 to fill the remaining gap (empty space) of each of the contact holes H. In an embodiment, the gap-filling insulation layer 140 may be formed by a spin deposition process. For example, the gap-filling insulation layer 140 may include any suitable flowable spin-on dielectric material which has an adequately effective gap-filling characteristic to prevent forming of voids inside the contact holes H. The SOD material may include any of a plurality of suitable solvents. The SOD material and/or the channel layer 135 may be heated to improve the flowability of the flowable SOD material, however, the invention is not limited in this way. In an embodiment, the gap-filling insulation layer 140 may be formed using a PSZ-SOD (perhydropolysilazane-based inorganic spin-on dielectric) which has an adequately effective gap-filling characteristic. The gap-filling insulation layer 140 may be formed to have a sufficient thickness for burying the contact holes H. Following the deposition of the SOD material, a curing or baking step may follow to remove any remaining solvent and to solidify the insulation layer 140. The gap-filling insulation layer 140, the channel layer 135 and the memory layer 130 may then be planarized to expose a surface of the hard mask layer HM. For example, a CMP (chemical/mechanical planarization) process may be used.

The second layers 115 may then be selectively removed to define a plurality of corresponding gate regions. For example, the second layer 115 may be removed by a wet etching process.

Conductive layers may be formed in the gate regions to form a plurality of corresponding gates (also referred to herein as gate lines) 150s, 150 and 150d. The gate 150s may correspond to a gate of a lower source selection transistor. The gate 150 may correspond to gates of memory cell transistors. The gate 150d may correspond to an uppermost gate of a drain selection transistor. The conductive layer may include a polysilicon layer doped with impurities.

In an embodiment, the gate 150s of the source selection transistor and the gate 150d of the drain selection transistor may be a single gate. Alternatively, the gate 150s of the source selection transistor and the gate 150d of the drain selection transistor may be a plurality of gates. In the present embodiment, the gate of the drain selection transistor may correspond to the uppermost gate 150d, when the gate 150 of the drain selection transistor may be the plurality of gates.

Figure 3E:
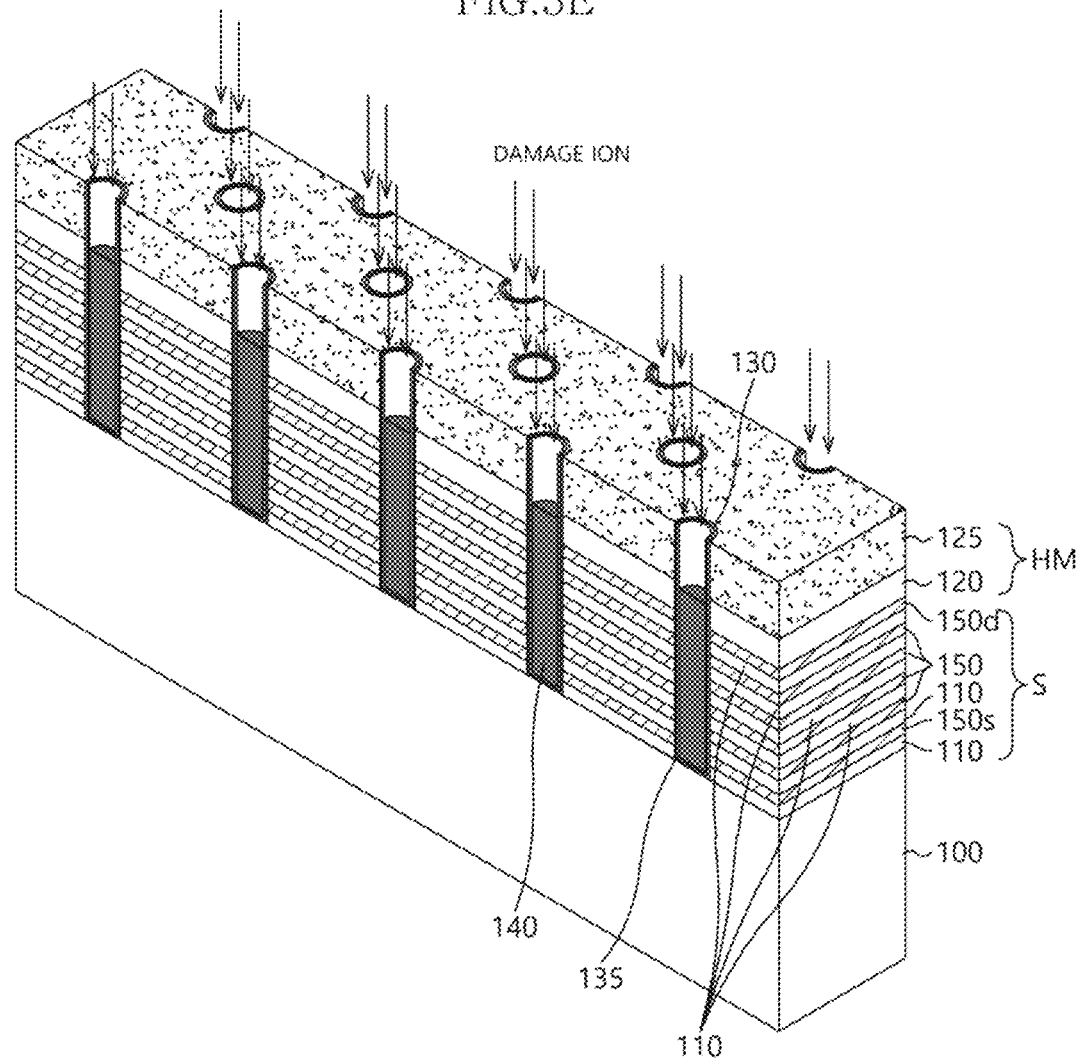
Figure 4E:
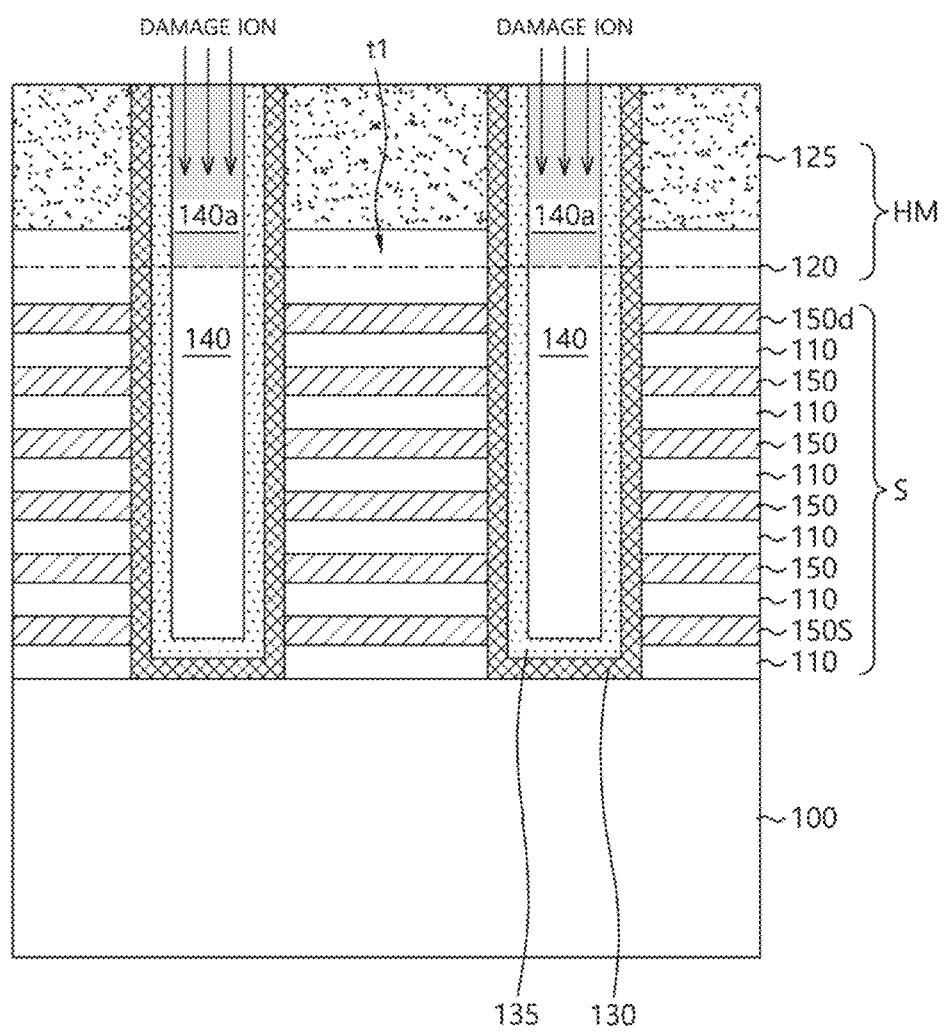

As illustrated in FIGS. 3E and 4E, the gap-fill insulating layer 140 may be partially removed to define a preliminary junction region of the drain selection transistor such as a drain.

In order to define the preliminary junction region of the drain selection transistor, accurate etching of the gap-fill insulating layer 140 is highly desirable for improving the electrical characteristics of the formed transistor.

For example, when the gap-fill insulating layer 140 is etched less than a target thickness, the drain of the drain selection transistor may not overlap with the edge of the gate 150d in the drain selection transistor so that a channel of the drain selection transistor may not be generated.

In contrast, when the gap-fill insulating layer 140 is etched more than the target thickness, the gate of the drain selection transistor may have a sufficiently narrow width so that the drain of the drain selection transistor may have a width that is too narrow and may cause punch through.

The present invention addresses these issues by accurately etching the gap-fill insulating layer 140. Specifically, an etched depth of the gap-fill insulating layer 140 is predetermined to position an interface of the junction region in the drain selection transistor at an upper edge of the uppermost gate. [0048] Therefore, in order to form a normal channel of the drain selection transistor, the etching process of the gap-fill insulating layer 140 for defining the junction interface of the junction region is important.

The target thickness may be set in accordance with a diffusion depth of impurities in the capping layer. For example, the capping layer may include conductive impurities. The conductive impurities in the capping layer may diffuse into an adjacent area of the channel layer 135 in a following thermal process. Thus, the junction region (drain) of the drain selection transistor may include a portion of the channel layer 135 wherein the conductive impurities have diffused from the capping layer during the thermal process of activating the conductive impurities. As a result, the junction interface of the junction region of the drain selection transistor may be generated in the channel layer 135. Because a distance between the target thickness and the junction interface may correspond to the diffusion depth, the target thickness may be set in accordance with the diffusion depth.

As shown in FIGS. 3E and 4E, in order to accurately control the etched depth of the gap-fill insulating layer 140, before etching the gap-fill insulating layer 140, damage ions may be implanted into the gap-fill insulating layer 140 to generate artificial damages within the gap-fill insulating layer 140. The damage ions may be implanted up to a first etch target position t1 of the gap-fill insulating layer 140.

The gap-fill insulating layer 140 implanted with damage ions may have an etching selectivity different from that of the gap-fill insulating layer 140 without the damage ions. The damage ions may include inert ions such as argon ions. However, any ions which are suitable for changing the etching property of the gap-fill insulating layer 140 may be used.

Figure 3F:
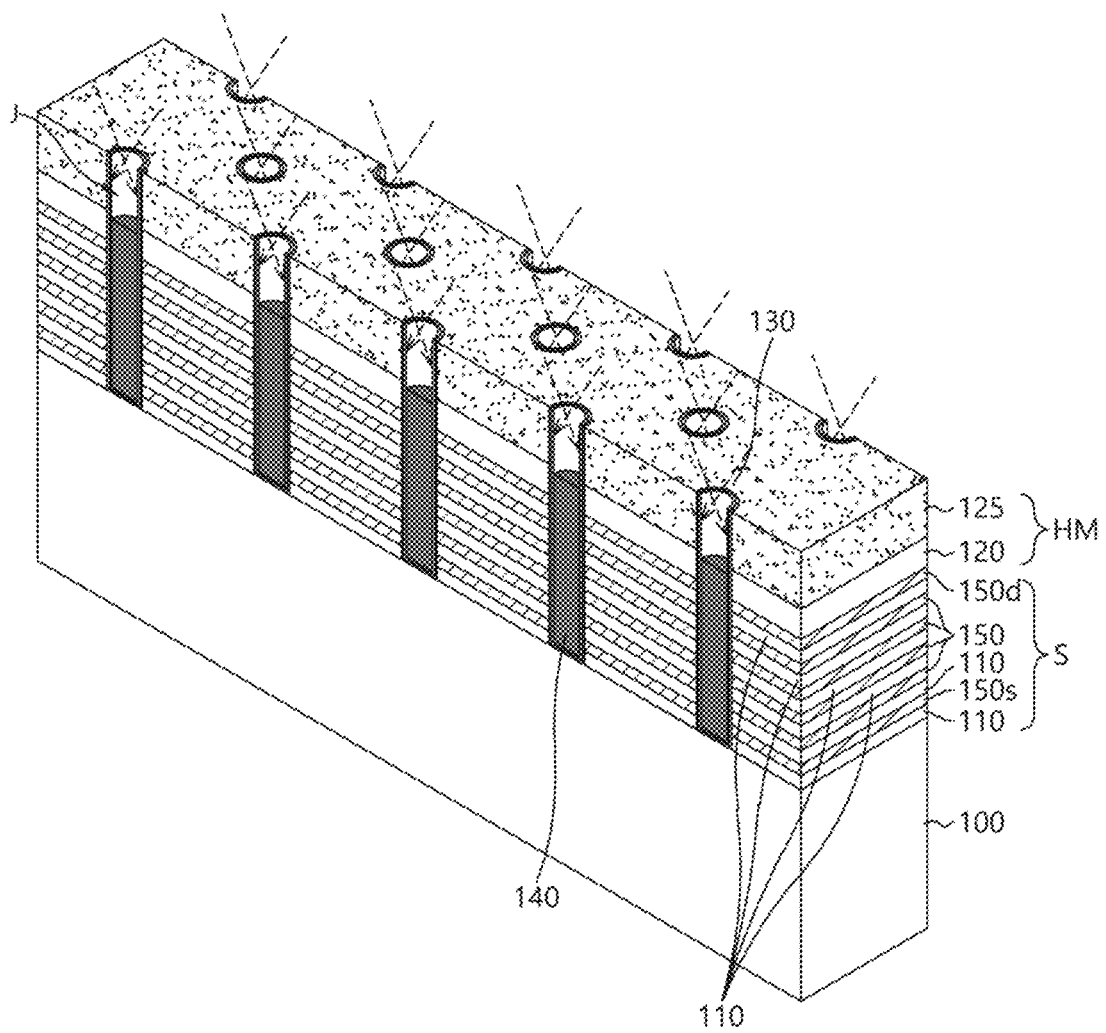
Figure 4F:
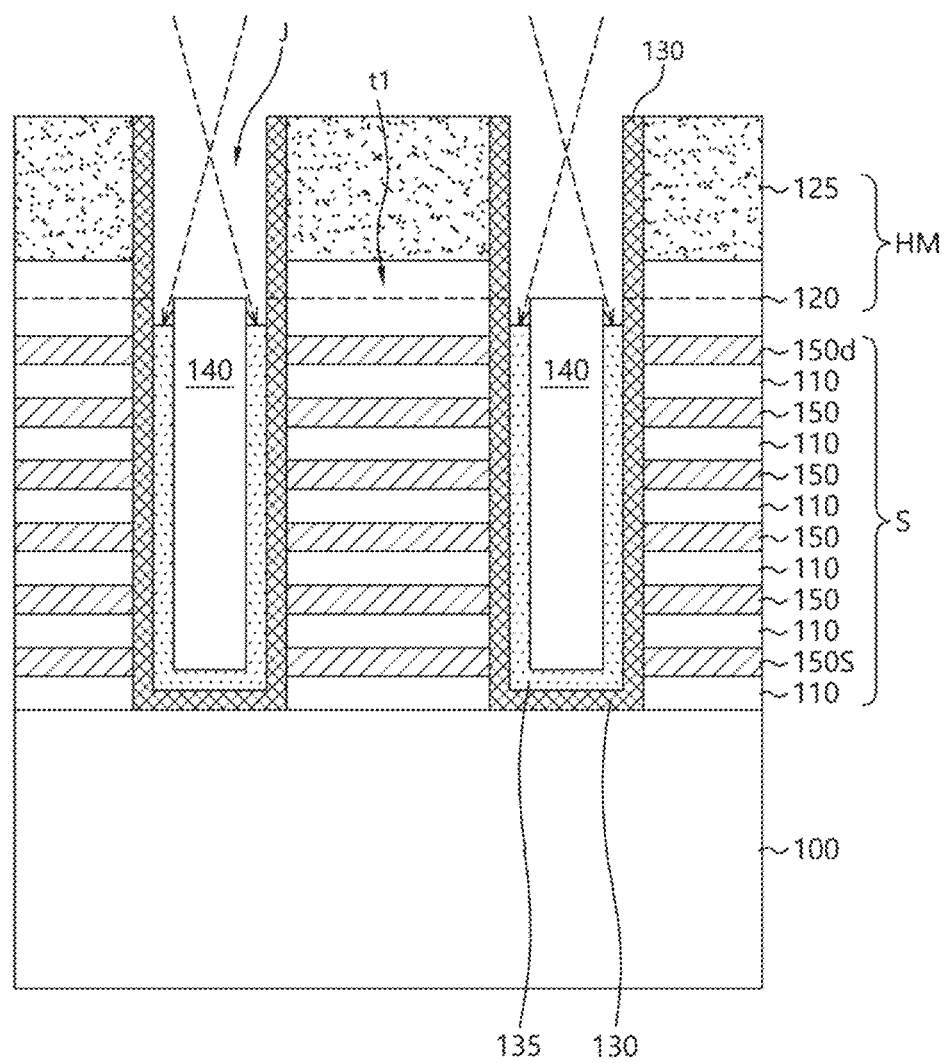

Referring to FIGS. 3F and 4F, the gap-fill insulating layer 140a which has been doped with the damage ions has been selectively removed up to the etch target depth U. The channel layer 135 may then also be selectively removed until an exposed surface of the channel layer 135 may correspond to a top surface of the gate 150d in the drain selection transistor to form the preliminary junction region J. The channel layer 135 may be removed by an incline etching process so that the top surface of the remaining gap-fill insulation 140 is at a higher level than the top surface of the channel layer 135.

For example, when the channel layer 135 may include the intrinsic polysilicon layer, conductive ions may be implanted into the channel layer 135 to give a conductivity to the channel layer 135. When the drain selection transistor, the memory transistor and the source selection transistor may include an NMOS transistor, the ions for forming the channel may include boron having a channel concentration range substantially similar to that of a general NMOS transistor.

Figure 4G:
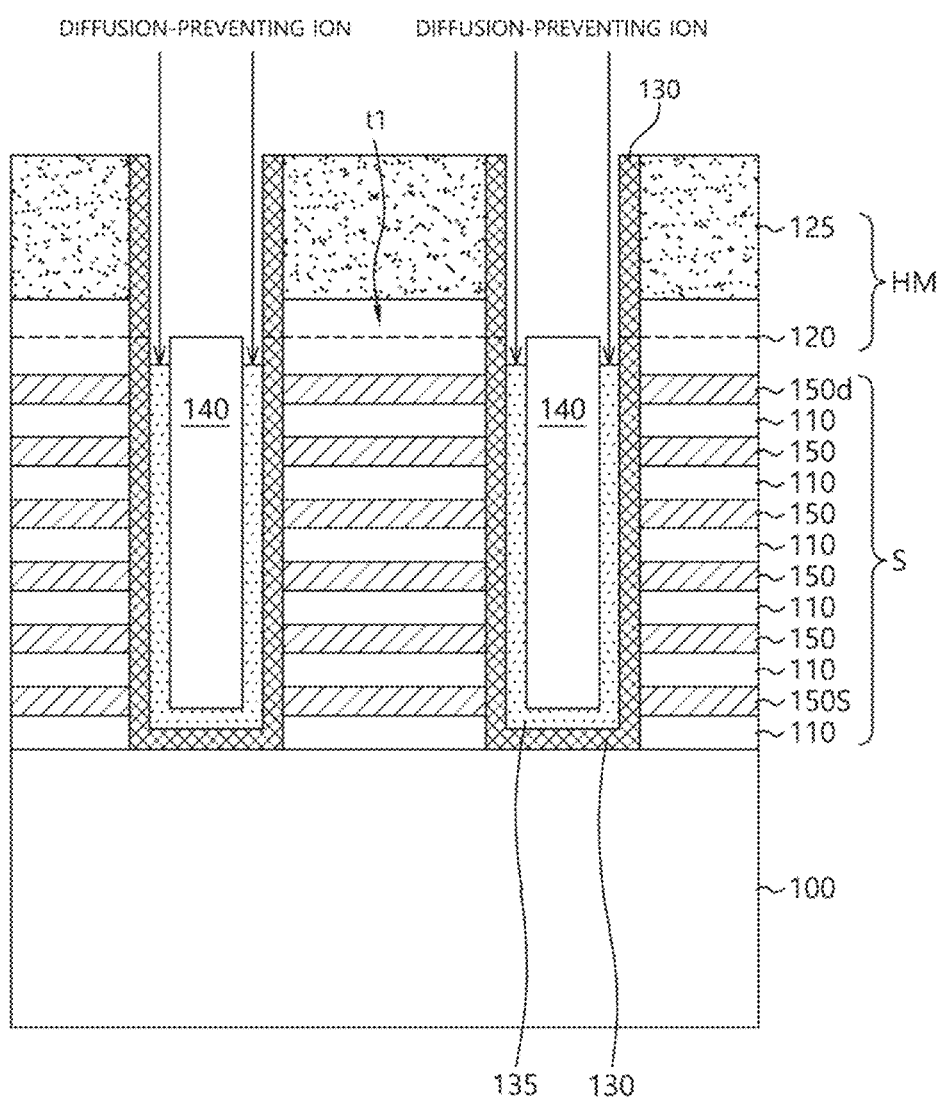

Referring to FIGS. 3G and 4G, diffusion-preventing ions may be implanted into the channel layer 135. The diffusion-preventing ions may include carbon ions. The diffusion-preventing ions in the channel layer 135 may prevent diffusions of impurities in other layers into the channel layer 135. When carbon ions are implanted into a specific layer, the carbon in the specific layer may have a cluster shape or a substitutive carbon shape. For example, when carbon ions having a concentration of about $2E15/cm^2$ to about $2.5E15/cm^2$ are implanted into the channel layer 135, the channel layer 135 may be in an amorphous state and the carbon ions may function as an interstitial trap material to suppress diffusions of the impurities into the channel layer 135.

Figure 3H:
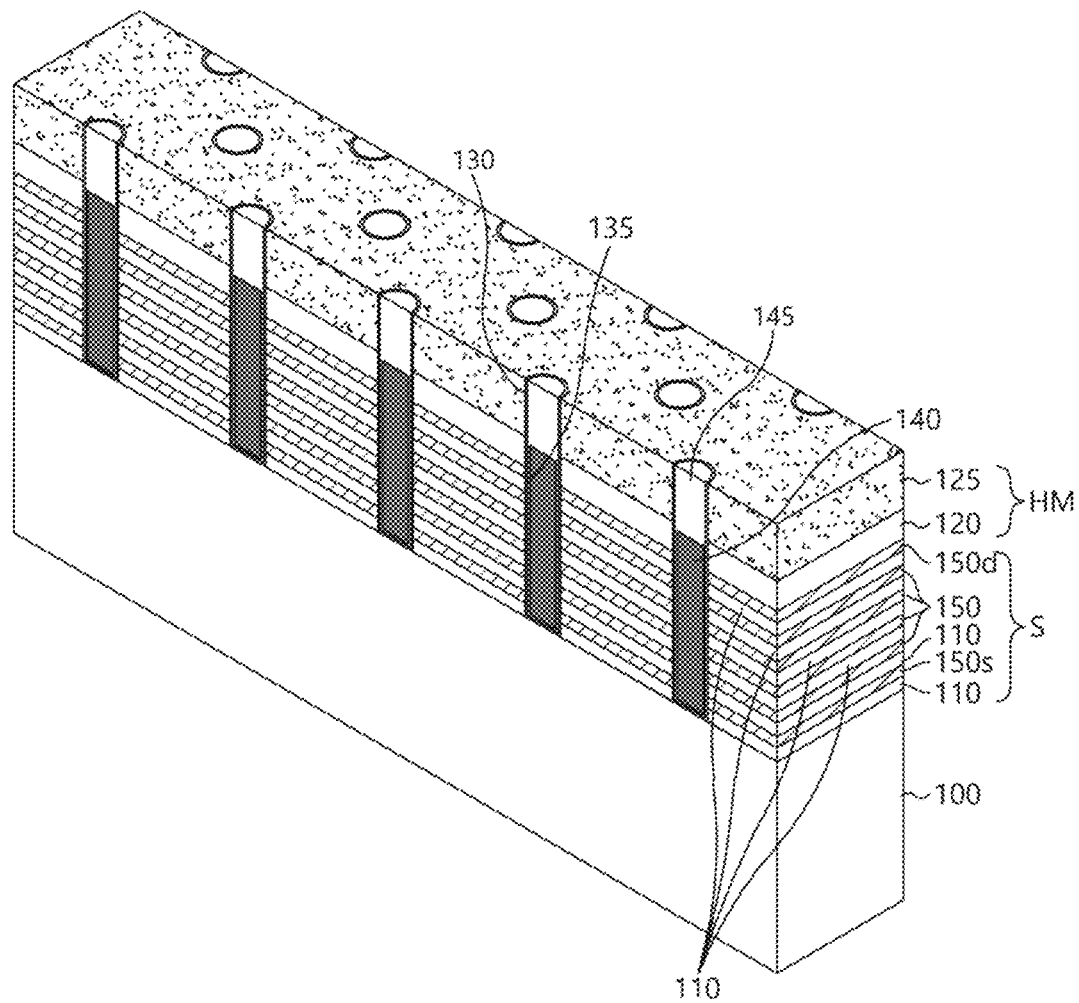
Figure 4H:
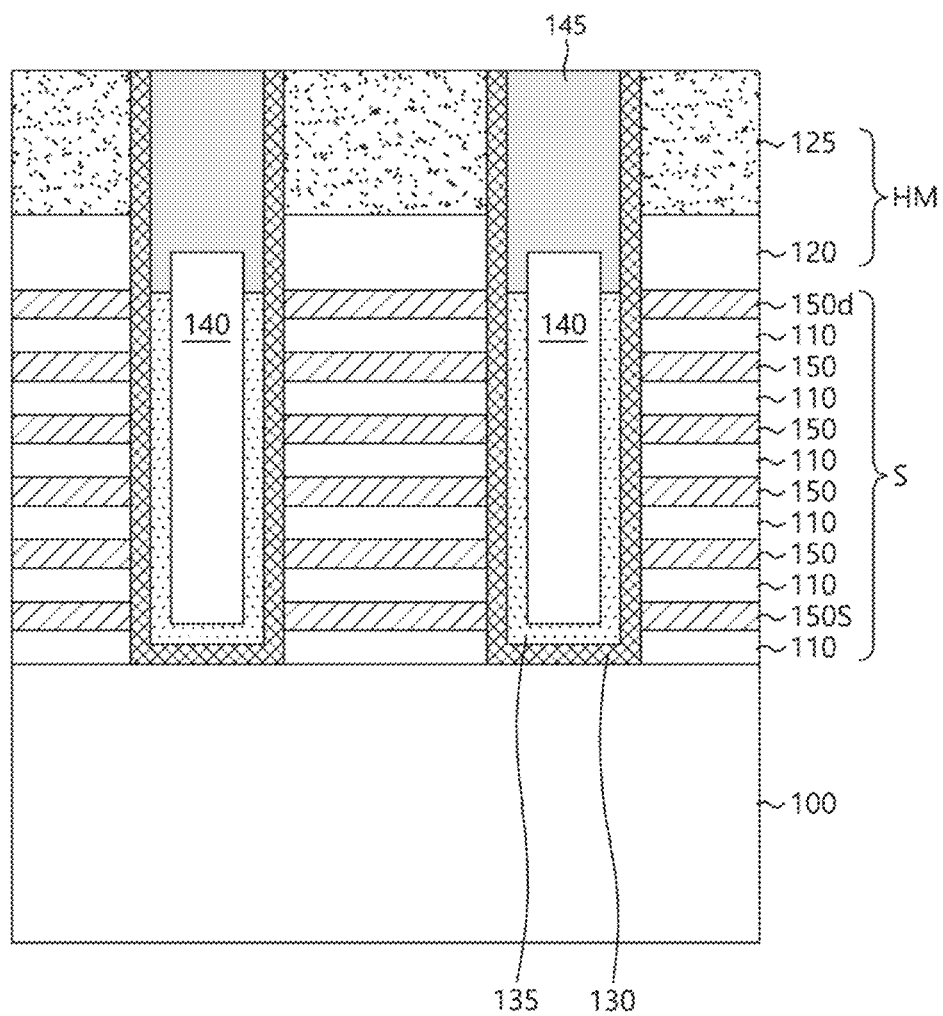

Referring to FIGS. 3H and 4H, a polysilicon layer may be formed on the gap-fill insulating layer 140 to fill up the preliminary junction region J. The polysilicon layer may be planarized until the hard mask pattern HM may be exposed to form a capping layer 145. Additionally, in order to operate the capping layer 145 as the junction region, for example, the drain of the drain selection transistor, conductive ions may be implanted into the capping layer 145. When the drain selection transistor may include an NMOS transistor, the conductive ions may include N type impurities such as P (Phosphorous) ions or As (Arsenic) ions.

In order to activate the N type impurities in the capping layer 145, the capping layer 145 may be thermally treated. Typically, in existing processes, the N type impurities may generally diffuse into the channel layer 135 during the thermal treatment process. However, according to the described embodiment of the present invention because of the diffusion-preventing which are implanted into the channel layer 135, the N type impurities cannot diffuse inside the channel layer 135 during the thermal treatment process. Thus, the junction interface of the drain selection transistor is not changed during the thermal processing step and thus it can be ensured that the positioning of the interface is more accurate at the predetermined desired depth. This in turn reduces the variation of the PFH of the drain selection transition and improves its reliability and performance characteristics. In addition, because of the more accurate positioning the thickness of the gate may be reduced further without compromising the reliability and performance characteristics of the drain selection transistor. For example, in a non-limiting embodiment of the present invention the PFH of the drain select transistor may be controlled at a level of 400 Å with an adequate. The channel layer 135 may be crystallized by the thermal treatment process.

Figure 5:
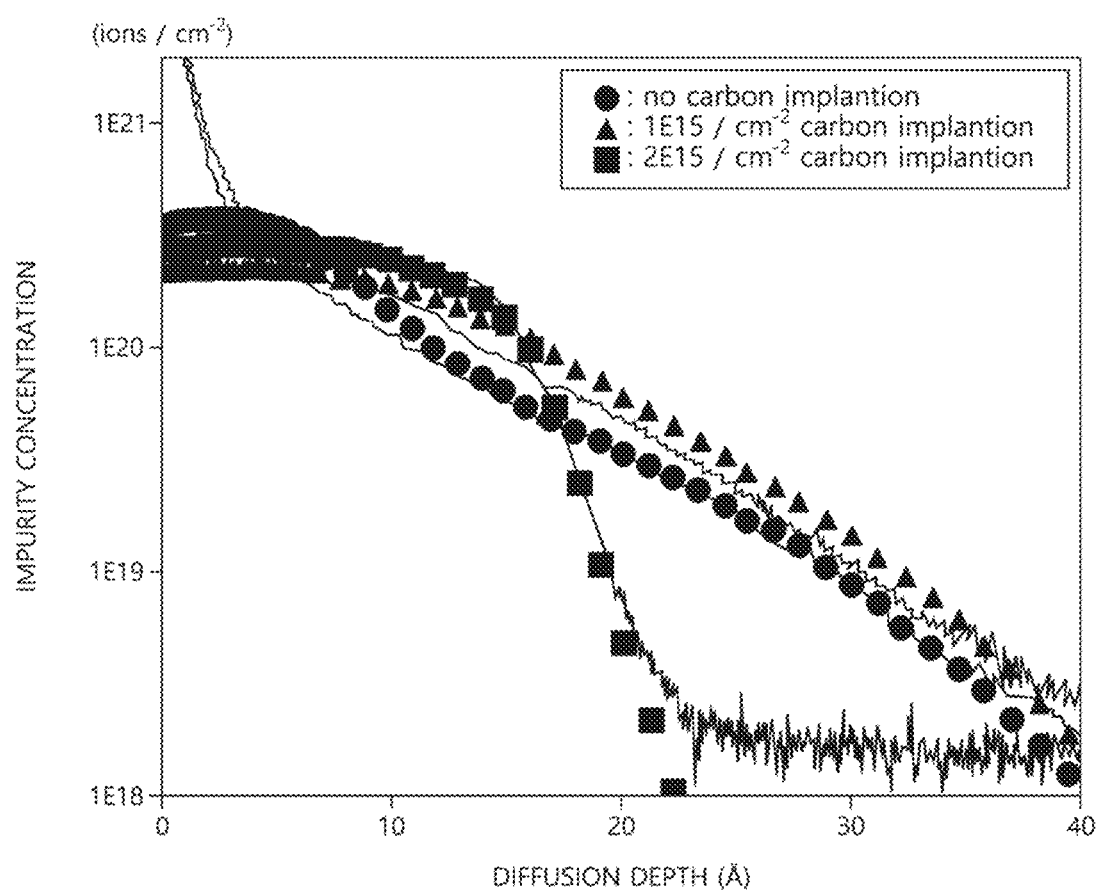
FIG. 5 is a graph showing a diffusion depth in accordance with a carbon ion implantation.

FIG. 5 is a graph showing a diffusion depth in accordance with a carbon ion implantation. In FIG. 5, an X-axis may represent a diffusion depth and a Y-axis may represent an impurity concentration in the capping layer 145. A line ○ may indicate the diffusion depth when the carbon ions may not be implanted into the channel layer 135, a line △ may indicate the diffusion depth when the carbon ions having a concentration of about $1E15/cm^2$ may be implanted into the channel layer 135, and a line □ may indicate the diffusion depth when the carbon ions having a concentration of about $2E15/cm^2$ may be implanted into the channel layer 135.

Referring to FIG. 5, it may be noted that the diffusion depth when carbon ions having a concentration of about $2E15/cm^2$ implanted into the channel layer 135 may be remarkably reduced when compared to the diffusion depths the when the carbon ions are implanted into the channel layer 135, or when the carbon ions having a concentration of about $1E15/cm^2$ are implanted into the channel layer 135.

According to example embodiments, the diffusion-preventing ions may be implanted into the channel layer 135 to prevent the diffusions of the ions from the capping layer 145. Thus, the junction interface of the drain selection transistor may be accurately controlled. More specifically, according to the present invention, the junction interface of the drain selection transistor may be accurately controlled by first controlling precise etching of the gap-fill insulating layer 140 up to a desired predetermined etch target position t1 which takes into account the diffusion depth of the conductive impurities which are to be later added into the polysilicon material to create the drain (or source) of the drain select transistor. Moreover, by treating the surface of the remaining channel layer 135 with diffusion preventing ions such as carbon ions it is ensured that the conductive impurities do not diffuse into the portion of the channel layer which is set to become the channel of the drain select transistor. This way the junction interface can be positioned accurately, and in a reliable, repeatable manner at the same level or substantially at the same level as the top surface of the drain gate, thus reducing the structural variations inherent in existing processes. For example, the PFH of the drain select transistor can be controlled much more reliably and accurately than existing processes which in turn allows for substantial improvements in the yield of the manufacturing process (fewer failed devices during manufacturing) and improved performance characteristics transistors and 3D, NVM devices.

Figure 6A:
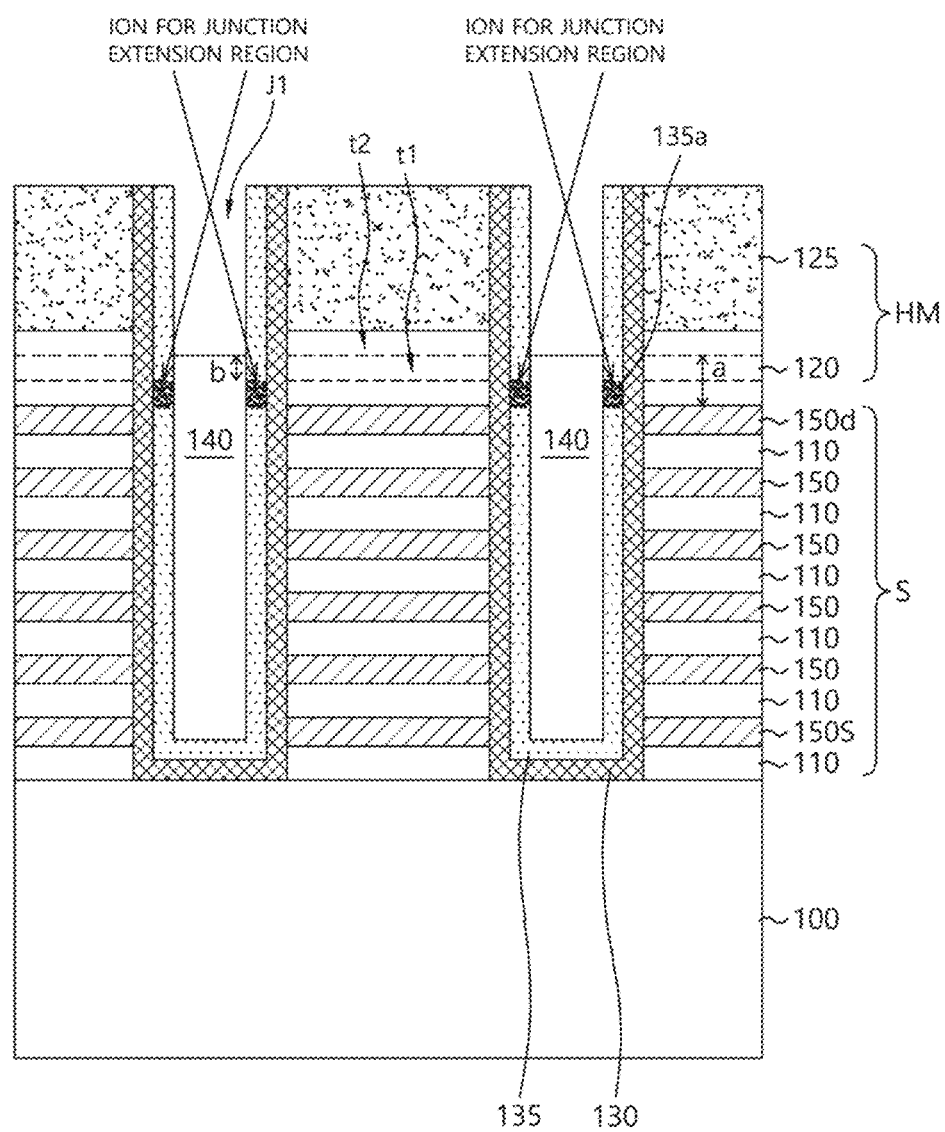
FIGS. 6A and 6B are cross-sectional views illustrating a method of manufacturing a three-dimensional non-volatile memory device in accordance with example embodiments.
Figure 6B:
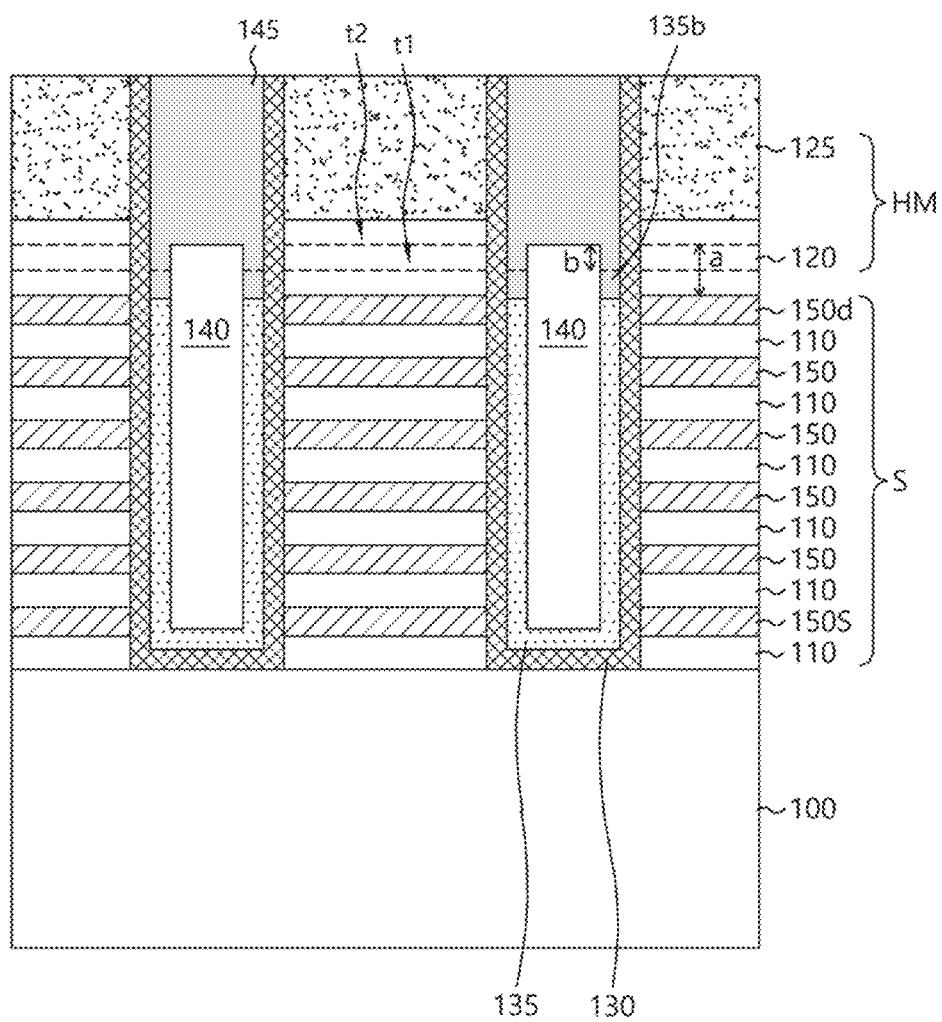

FIGS. 6A and 6B are cross-sectional views illustrating a method of manufacturing a 3D, NVM device in accordance with an embodiment of the present invention.

Processes substantially the same as those illustrated with reference to FIGS. 4A to 4D may be performed.

Referring to FIG. 6A, the gap-fill insulating layer 140 in the contact hole H may be etched until the thickness of the gap-fill insulating layer 140 may reach to a second target depth t2 to form a preliminary junction region J1. The second target depth t2 may have a depth less than that of the first target depth t1. Therefore, the preliminary junction region J1 of this example embodiment may have a depth less than that of the preliminary junction region J in FIG. 4F. Further, a distance "a" between the surface of the gate 150d in the drain selection transistor and the second target depth t2 may be greater than an impurity diffusion distance "b" of the capping layer formed later. Because the distance "a" between the surface of the gate 150d in the drain selection transistor and the second target depth t2 may be greater than the impurity diffusion distance "b" of the capping layer, the gap-fill insulating layer 140 may be removed by a general etching process.

After partially removing the gap-fill insulating layer 140, P type impurities may be implanted into the exposed channel layer 135 to provide the channel layer 135 with p type conductivity. The P type impurities (such as Phosphorous impurities) may be added to have a concentration substantially similar to that of a channel impurity in a general NMOS transistor.

Then, N type impurities may be implanted into the channel layer 135 corresponding to an upper portion of the gate 150d of the drain selection transistor to define a junction extension region. The N type impurities may be implanted into the channel layer 135 by an inclined ion-implantation process. For example, the N type impurities for the junction extension region may be substantially the same as the impurities in the capping layer. Further, the N type impurities for the junction extension region may have a concentration substantially the same as that of the impurities in the capping layer. Furthermore, an ion implantation range of the N type impurities for the junction extension region may be distributed between an interface of the capping layer and the gate 150d of the drain selection transistor considered the diffusion distance of the N type impurities for the junction extension region.

A target projecting depth of the N type impurities for junction extension region may be set in accordance with the diffusion distance of the N type impurities in a following thermal treatment process. For example, the target projecting depth of the N type impurities junction extension region may be controlled to match the junction interface of the junction region formed by the thermal treatment process with an upper surface of the gate 150d in the drain selection transistor. The reference numeral 135a indicates a region into which the N type impurities for junction extension region is implanted.

In some cases, carbon ions as diffusion-prevention ions may be additionally implanted into the channel layer 135 under the impurity region 135a for forming the junction extension region (see FIG. 4G).

Referring to FIG. 6B, the preliminary junction region J1 may be filled with a polysilicon layer. The polysilicon layer may be planarized until the hard mask pattern HM may be exposed to form the capping layer 145 in the preliminary junction region J1. In order to operate the capping layer 145 as the junction region, the capping layer 145 may be implanted to include N type impurities having a high concentration.

The capping layer 145 may be thermally treated to activate the N type impurities in the capping layer 145. Some of the N type impurities in the capping layer 145 may diffuse into the channel layer 135 as well as the capping layer 145 during the thermal treatment process. Thus, the junction region (drain) of the drain selection transistor may be extended from the capping layer 145 to a portion of the channel layer 135 adjacent to the capping layer 145.

The N type impurities for forming the junction extension region in the channel layer 135 may also be activated during the thermal treatment process. Thus, the junction extension region 135b may be formed between the capping layer 145 and a portion of the channel layer 135 corresponding to an upper surface of the gate 150d of the drain selection transistor.

According to example embodiments, the junction extension region connected with the junction region of the drain selection transistor may be formed in the channel layer. Therefore, the etching process of the gap-fill insulating layer may be simplified. Further, a channel generation error of the drain selection transistor may also be prevented.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present invention disclosure and are intended to fall within the scope of the appended claims.

What is claimed is:

1. A method of manufacturing a non-volatile memory device, the method comprising:
   forming a stack structure in which an insulating layer and a sacrificial layer are alternately stacked two or more times, wherein the stack structure includes a plurality of insulating layers and a plurality of sacrificial layers;
   forming a contact hole through the stack structure;
   forming a channel layer on an inner surface of the contact hole;

filling the contact hole with a gap-fill insulating layer;
selectively removing the sacrificial layers to form a plurality of spaces;
forming conductive layers in each of the plurality of spaces to form a plurality of conductive gates, positioned between the insulating layers;
etching the gap-fill insulating layer by a target depth to form a preliminary junction region;
etching a portion of the channel layer, to provide the channel layer with a top surface substantially coplanar corresponding to a top surface of an uppermost gate among the gates;
implanting diffusion-preventing ions into a selected portion of the channel layer; and
forming a capping layer with conductive impurities in the preliminary junction region to form a junction region.

2. The method of claim 1, wherein the diffusion-preventing ions comprise carbon ions.

3. The method of claim 2, wherein the carbon ions have a concentration of about $2E15/cm^2$ to about $2.5E15/cm^2$.

4. The method of claim 1, wherein the sacrificial layer has an etching selectivity different from that of the insulating layer.

5. The method of claim 1, further comprising forming a memory layer on the inner surface of the contact hole before forming the channel layer and forming the channel layer on the memory layer.

6. The method of claim 1, wherein forming the preliminary junction region comprises:
implanting damage ions into a top-portion of the gap-fill insulating layer up to a depth inside the gap-fill insulating layer equal to the target depth; and
selectively removing the top-portion of the gap-fill insulating layer which has been implanted with the damage ions.

7. The method of claim 1, wherein etching a portion of channel layer is etched by an inclined etching process.

8. The method of claim 1, further comprising implanting conductive ions into the channel layer to give a conductivity to the channel layer between etching the channel layer and implanting the diffusion-preventing ions.

9. The method of claim 1, wherein forming the capping layer comprises:
forming a polysilicon layer with conductive impurities in the preliminary junction region; and
planarizing the polysilicon layer with the conductive impurities.

10. The method of claim 9, further comprising thermally treating the capping layer to activate the conductive impurities.

11. The method of claim 10, wherein the target depth is set in accordance with a diffusion distance of the conductive impurities in the capping layer.

12. A method of manufacturing a non-volatile memory device, the method comprising:
forming a stack structure in which an insulating layer and a sacrificial layer are alternately stacked two or more times, wherein the stack structure includes a plurality of insulating layers and a plurality of sacrificial layers;
forming a contact hole through the stack structure;
forming a channel layer on an inner surface of the contact hole;
filling the contact hole with a gap-fill insulating layer;
selectively removing the sacrificial layers to form a plurality of spaces;
forming conductive layers in each of the plurality of spaces to form a plurality of conductive gates, positioned between the insulating layers;
etching the gap-fill insulating layer to a depth shallower than a target depth to define a preliminary junction region;
implanting impurities into a portion of the channel layer to form a junction extension region that has a bottom surface substantially coplanar with a top surface of an uppermost gate among the conductive gates; and
forming a capping layer with conductive impurities in the preliminary junction region.

13. The method of claim 12, wherein the target depth is set in accordance with a diffusion distance of the conductive impurities in the capping layer.

14. The method of claim 13, wherein the impurities for forming the junction extension region are implanted into the channel layer between the capping layer and the uppermost gate.

15. The method of claim 12, wherein the impurities for forming the junction extension region are implanted into the channel layer using an incline implantation process.

16. The method of claim 12, further comprising implanting channel doping ions into the channel layer to give a conductivity to the channel layer between defining the preliminary junction region and forming the junction extension region.

17. The method of claim 12, wherein forming the capping layer comprises:
forming a polysilicon layer with conductive impurities in the preliminary junction region; and
planarizing the polysilicon layer with the conductive impurities.

18. The method of claim 12, further comprising thermally treating the capping layer to activate the conductive impurities.

19. The method of claim 12, further comprising implanting diffusion-preventing ions into a portion of the channel layer adjacent to the portion of the channel layer which has the implanted impurities for forming the junction region.

* * * * *